(12) United States Patent
Riepen et al.

(10) Patent No.: US 8,547,523 B2
(45) Date of Patent: Oct. 1, 2013

(54) FLUID HANDLING STRUCTURE, LITHOGRAPHIC APPARATUS AND DEVICE MANUFACTURING METHOD

(75) Inventors: Michel Riepen, Veldhoven (NL); Nicolaas Rudolf Kemper, Eindhoven (NL)

(73) Assignee: ASML Netherlands B.V., Veldhoven (NL)

(*) Notice: Subject to any disclaimer, the term of this patent is extended or adjusted under 35 U.S.C. 154(b) by 610 days.

(21) Appl. No.: 12/785,913

(22) Filed: May 24, 2010

(65) Prior Publication Data

US 2010/0313974 A1 Dec. 16, 2010

Related U.S. Application Data

(60) Provisional application No. 61/181,158, filed on May 26, 2009, provisional application No. 61/239,555, filed on Sep. 3, 2009.

(51) Int. Cl.
*G03B 27/42* (2006.01)
*G03B 27/52* (2006.01)

(52) U.S. Cl.
USPC .................................. 355/53; 355/30

(58) Field of Classification Search
USPC ........................ 355/30, 53, 72–76
See application file for complete search history.

(56) References Cited

U.S. PATENT DOCUMENTS

| 4,509,852 | A | 4/1985 | Tabarelli et al. |
| 7,367,345 | B1* | 5/2008 | Hemker et al. ............ 134/95.2 |
| 7,423,720 | B2 | 9/2008 | Verspay et al. |
| 7,701,550 | B2* | 4/2010 | Kemper et al. ................ 355/53 |
| 7,749,689 | B2 | 7/2010 | Hemker et al. |
| 7,834,974 | B2 | 11/2010 | Kemper et al. |
| 8,031,325 | B2 | 10/2011 | Kemper et al. |
| 8,351,018 | B2 | 1/2013 | Direcks et al. |
| 2004/0136494 | A1 | 7/2004 | Lof et al. |
| 2004/0207824 | A1 | 10/2004 | Lof et al. |
| 2006/0119809 | A1 | 6/2006 | Verhagen et al. |
| 2007/0268466 | A1 | 11/2007 | Leenders et al. |

(Continued)

FOREIGN PATENT DOCUMENTS

| CN | 1892438 | 1/2007 |
| EP | 1 420 300 A2 | 5/2004 |

(Continued)

OTHER PUBLICATIONS

Japanese Office Action dated Jan. 5, 2012 in corresponding Japanese Patent Application No. 2010-114836.

(Continued)

*Primary Examiner* — Hung Henry Nguyen
(74) *Attorney, Agent, or Firm* — Pillsbury Winthrop Shaw Pittman LLP

(57) ABSTRACT

A fluid handling structure has a plurality of openings acting as a meniscus pinning system operating on the gas drag principle and a gas knife outwardly of the meniscus pinning system to break-up any film of liquid left behind. The separation between the gas knife and the meniscus pinning system is selected from the range of 1 mm to 5 mm. Desirably the underside of a barrier member in which the gas knife and the meniscus pinning system are provided is continuous, e.g. has no openings, between the gas knife and the meniscus pinning system.

20 Claims, 10 Drawing Sheets

(56) References Cited

U.S. PATENT DOCUMENTS

| | | |
|---|---|---|
| 2008/0212046 A1* | 9/2008 | Riepen et al. ............... 355/30 |
| 2009/0279062 A1 | 11/2009 | Direcks et al. |
| 2010/0085545 A1 | 4/2010 | Direcks et al. |
| 2010/0097584 A1 | 4/2010 | Doguchi |

FOREIGN PATENT DOCUMENTS

| | | |
|---|---|---|
| EP | 1 681 597 A2 | 7/2006 |
| JP | 2006-060223 | 3/2006 |
| JP | 2006-1404940 | 6/2006 |
| JP | 2007-013151 | 1/2007 |
| JP | 2007-525007 T | 8/2007 |
| JP | 2007-318117 | 12/2007 |
| JP | 2008-147577 | 6/2008 |
| JP | 2008-147652 | 6/2008 |
| TW | 200615703 | 5/2006 |
| TW | 200632586 | 9/2006 |
| WO | 99/49504 A1 | 9/1999 |
| WO | 2005/064405 A2 | 7/2005 |

OTHER PUBLICATIONS

European Search Report dated Sep. 20, 2010 in corresponding European patent application No. 10162904.
Chinese Office Action dated Feb. 5, 2013 in corresponding Chinese Patent Application No. 201010188208.2.
Taiwan Office Action dated Jun. 19, 2013 in corresponding Taiwan Patent Application No. 099116547.

* cited by examiner

-- PRIOR ART --

-- PRIOR ART --

-- PRIOR ART --

-- PRIOR ART --

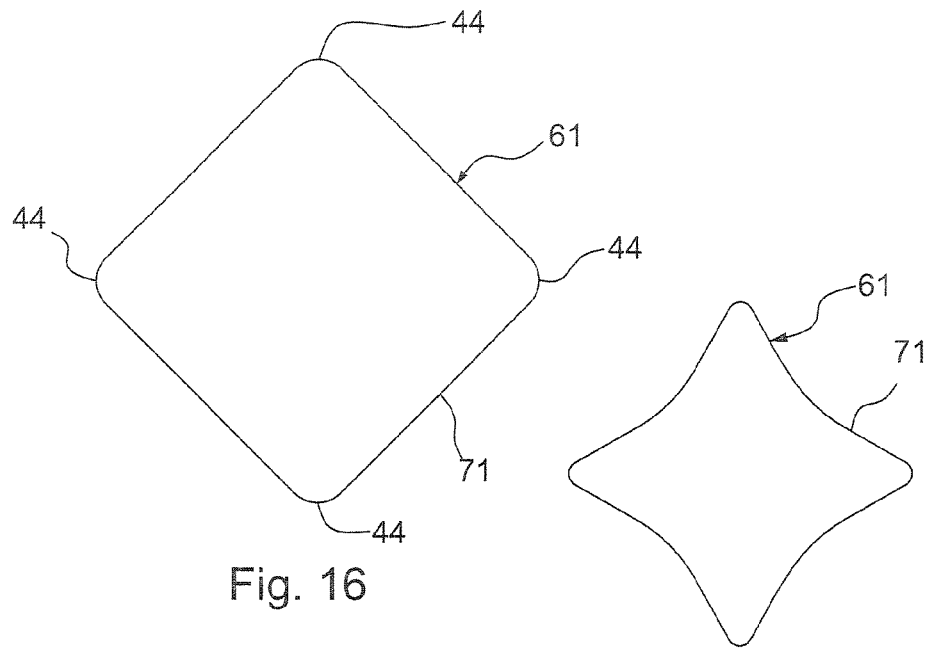
Fig. 16
Fig. 17
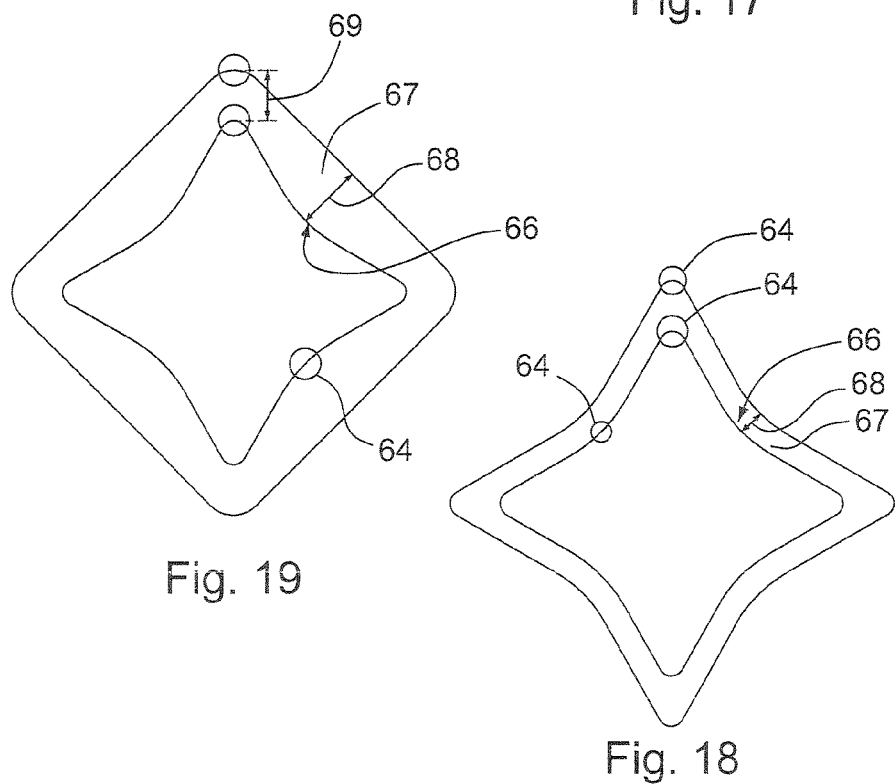
Fig. 19
Fig. 18

FLUID HANDLING STRUCTURE, LITHOGRAPHIC APPARATUS AND DEVICE MANUFACTURING METHOD

This application claims priority and benefit under 35 U.S.C. §119(e) to U.S. Provisional Patent Application No. 61/181,158, entitled "Fluid Handling Structure, Lithographic Apparatus and Device Manufacturing Method", filed on May 26, 2009, and to U.S. Provisional Patent Application No. 61/239,555, entitled "Fluid Handling Structure, Lithographic Apparatus and Device Manufacturing Method", filed on Sep. 3, 2009. The content of each of the foregoing applications is incorporated herein in its entirety by reference.

FIELD

The present invention relates to a fluid handling structure, a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of devices such as integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see, for example, U.S. Pat. No. 4,509,852) means that there is a large body of liquid that should be accelerated during a scanning exposure. This may require additional or more powerful motors and turbulence in the liquid may lead to undesirable and unpredictable effects.

In an immersion apparatus, immersion fluid is handled by a fluid handling system, structure or apparatus. A fluid handling system may supply immersion fluid and therefore be a fluid supply system. A fluid handling system may confine immersion fluid and thereby be a fluid confinement system. A fluid handling system may provide a barrier to immersion fluid and thereby be a barrier member, such as a liquid confinement structure. A fluid handling system may create or use a flow of fluid (such as gas), for example to help in handling liquid (e.g., controlling the flow and/or the position of the immersion fluid). The flow of gas may form a seal to confine the immersion fluid so the fluid handling structure may be referred to as a seal member, such a seal member may be a fluid confinement structure. Immersion liquid may be used as the immersion fluid. In that case, the fluid handling system may be a liquid handling system. In reference to the aforementioned description, reference in this paragraph to a feature defined with respect to fluid may be understood to include a feature defined with respect to liquid.

One of the arrangements proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504.

Another arrangement is an all wet arrangement in which the immersion liquid is unconfined as disclosed in PCT patent application publication no. WO 2005/064405. In such a system the whole top surface of the substrate is covered in liquid. This may be advantageous because then the whole top surface of the substrate is exposed to the substantially same conditions. This may have an advantage for temperature control and processing of the substrate. In WO 2005/064405, a liquid supply system provides liquid to the gap between the final element of the projection system and the substrate. That liquid is allowed to leak over the remainder of the substrate. A barrier at the edge of a substrate table prevents the liquid from escaping so that it can be removed from the top surface of the substrate table in a controlled way. Although such a system improves temperature control and processing of the substrate, evaporation of the immersion liquid may still occur. One way of helping to alleviate that problem is described in United States patent application publication no. US 2006/0119809. A member is provided which covers the substrate W in all positions and which is arranged to have immersion liquid extending between it and the top surface of the substrate and/or substrate table which holds the substrate.

In European patent application publication no. EP 1420300 and United States patent application publication no. US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

SUMMARY

It is desirable to be able to move the substrate as fast as possible below the projection system. For this, the fluid handling system, especially for a localized area fluid handling system, should be designed to allow high relative speed of movement without significant liquid loss or formation of bubbles. It is desirable that stepping and scanning motions can be performed at a close or similar speed, if not substantially the same speed.

It is desirable, for example, to provide a fluid handling system which maintains liquid in a space between the final element of the projection system and the substrate.

According to an aspect, there is provided a fluid handling structure for a lithographic apparatus, the fluid handling structure having a plurality of openings, the fluid handling structure configured such that the openings are directed, in use, towards a substrate and/or a substrate table configured to support the substrate, the fluid handling structure further comprising a gas knife device having an elongate aperture or a plurality of apertures arranged in a line, the aperture or the plurality of apertures being arranged at a distance from the openings selected from the range of 1 mm to 5 mm.

According to an aspect, there is provided a lithographic apparatus comprising a fluid handling structure for a lithographic apparatus, the fluid handling structure having a plurality of openings, the fluid handling structure configured such that the openings are directed, in use, towards a substrate and/or a substrate table configured to support the substrate, and the fluid handling structure further comprising a gas knife device having an elongate aperture or a plurality of apertures arranged in a line, the aperture or the plurality of apertures being arranged at a distance from the openings selected from the range of 1 mm to 5 mm.

According to an aspect, there is provided a lithographic apparatus comprising a substrate table configured to support a substrate and a fluid handling structure, the fluid handling structure having a plurality of openings configured for the passage of a two phase fluid flow, and comprising a gas knife device comprising an aperture located a distance away from the openings, wherein the fluid handling structure is configured such that the openings are directed, in use, towards the substrate and/or the substrate table, so that the openings are configured to remove liquid from between the fluid handling structure and the substrate, the substrate table, or both and so that most of the gas flow from the gas knife device flows though the openings.

According to an aspect, there is provided a fluid handling structure for a lithographic apparatus, the fluid handling structure having a plurality of meniscus pinning openings, the fluid handling, structure configured such that the openings are directed, in use, towards a substrate and/or a substrate table configured to support the substrate, the fluid handling structure further comprising a gas knife device having an elongate aperture or a plurality of apertures arranged in a line, and a damper arranged between the aperture or the plurality of apertures and the openings.

According to an aspect, there is provided a device manufacturing method comprising:
providing a fluid between a final element of a projection system and a substrate;
retrieving liquid from between the final element and the projection system by attaching an under pressure to a plurality of openings in a fluid handling structure; and
forcing liquid towards the plurality of openings by supplying gas through a plurality of apertures, the distance between the apertures and the openings being selected from the range of 1 mm to 5 mm.

According to an aspect, there is provided a lithographic apparatus comprising a fluid handling structure, the fluid handling structure having a plurality of openings, the fluid handling structure configured such that the openings are directed, in use, towards a substrate and/or a substrate table configured to support the substrate, and the fluid handling structure further comprising a gas knife device having at least an elongate aperture, the elongate aperture having a corner.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 16 illustrates, in plan, as a schematic representation a gas knife according to an embodiment of the invention;

FIG. 17 illustrates, in plan, as a schematic representation a gas knife opening according to an embodiment of the invention;

FIG. 18 illustrates, in plan, certain features of an embodiment of a fluid handling structure according an embodiment of the invention;

FIG. 19 illustrates, in plan, certain features of an embodiment of a fluid handling structure according to an embodiment of the invention.

DETAILED DESCRIPTION

Figure 1:
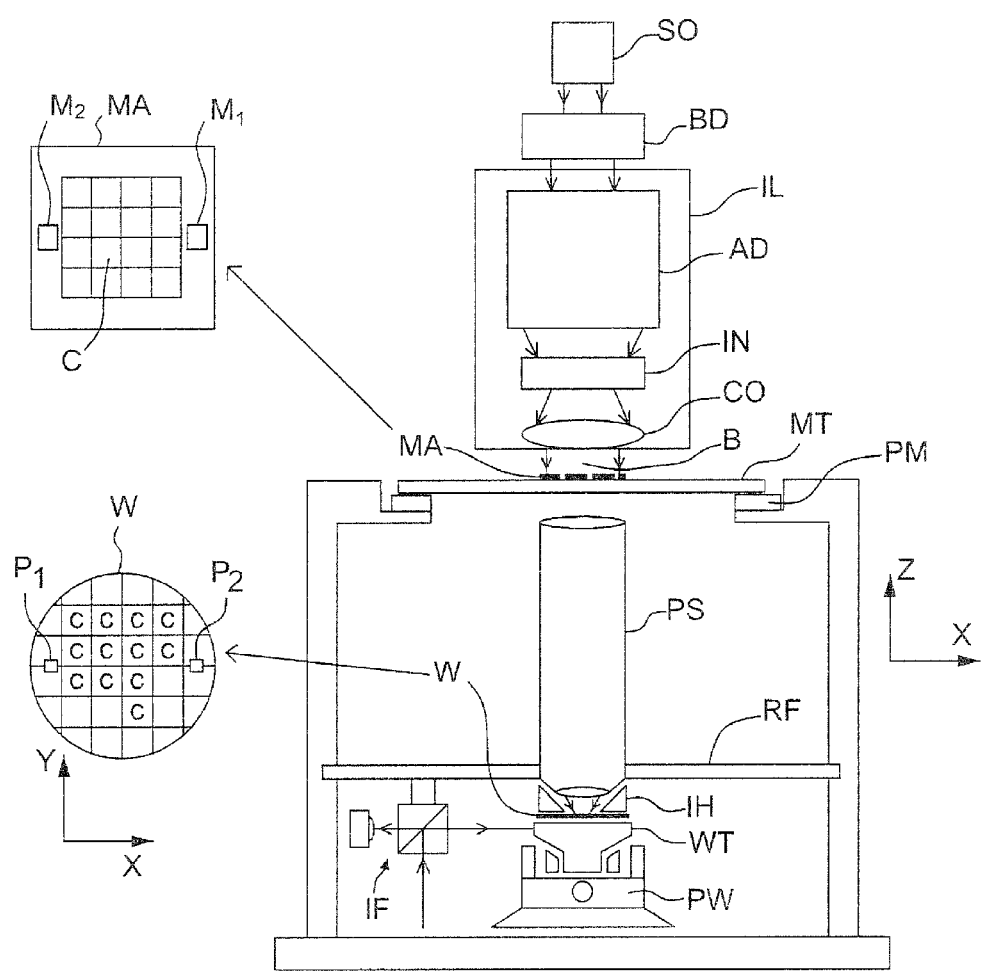
FIG. 1 depicts a lithographic apparatus according to an embodiment of the invention.

FIG. 1 schematically depicts a lithographic apparatus according to one embodiment of the invention. The apparatus comprises:
an illumination system (illuminator) IL configured to condition a radiation beam B (e.g. UV radiation or DUV radiation);
a support structure (e.g. a mask table) MT constructed to support a patterning device (e.g. a mask) MA and connected to a first positioner PM configured to accurately position the patterning device in accordance with certain parameters;
a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device. The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable minor array employs a matrix arrangement of small minors, each of which can be individually tilted so as to reflect an incoming radiation beam in different directions. The tilted minors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing, a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing minors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., support structure MT), and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Arrangements for providing liquid between a final element of the projection system PS and the substrate can be classed into three general categories. These are the bath type arrangement, the so-called localized immersion system and the all-wet immersion system. In the bath type arrangement substantially the whole of the substrate W and optionally part of the substrate table WT is submersed in a bath of liquid.

The localized immersion system uses a liquid supply system in which liquid is only provided to a localized area of the substrate. The space filled by liquid is smaller in plan than the top surface of the substrate and the area filled with liquid remains substantially stationary relative to the projection system PS while the substrate W moves underneath that area.

In the all wet arrangement the liquid is unconfined. The whole top surface of the substrate and all or part of the substrate table is covered in immersion liquid. The depth of the liquid covering at least the substrate is small. The liquid may be a film, such as a thin film, of liquid on the substrate. Immersion liquid may be supplied to or in the region of a projection system and a facing surface facing the projection system (such a facing surface may be the surface of a substrate and/or a substrate table). Any of the liquid supply devices of FIGS. 2-5 can also be used in such a system. However, sealing features are not present, are not activated, are not as efficient as normal or are otherwise ineffective to seal liquid to only the localized area.

Figure 2:
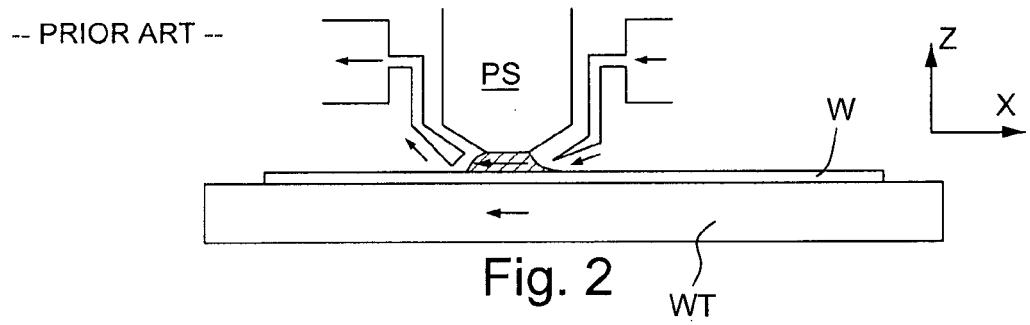
FIGS. 2 and 3 depict a liquid supply system for use in a lithographic projection apparatus.
Figure 3:
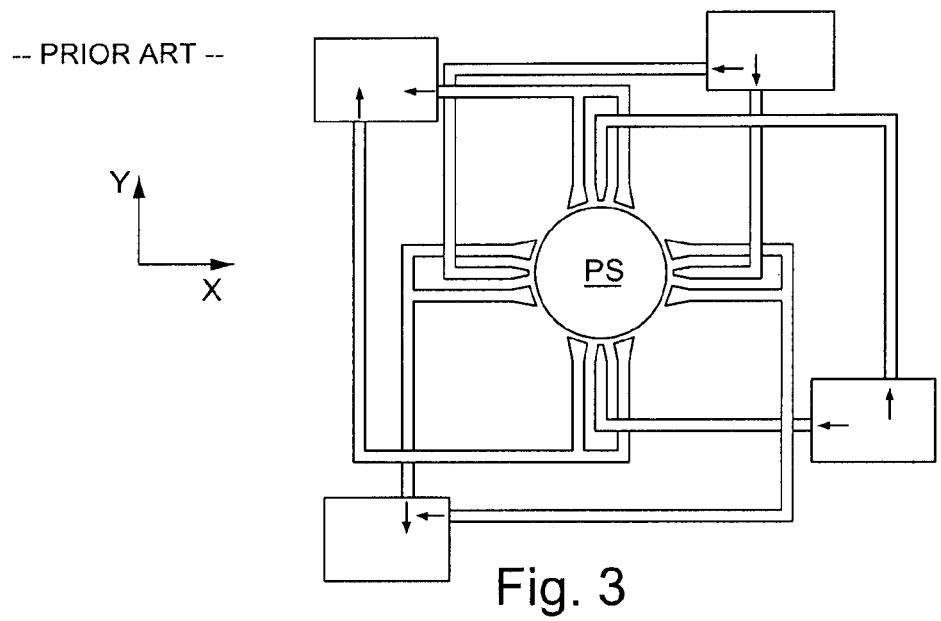

Four different types of localized liquid supply systems are illustrated in FIGS. 2-5. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible; one example is illustrated in FIG. 3 in which four sets of an inlet with an outlet on either side are provided in a regular pattern around the final element.

Figure 4:
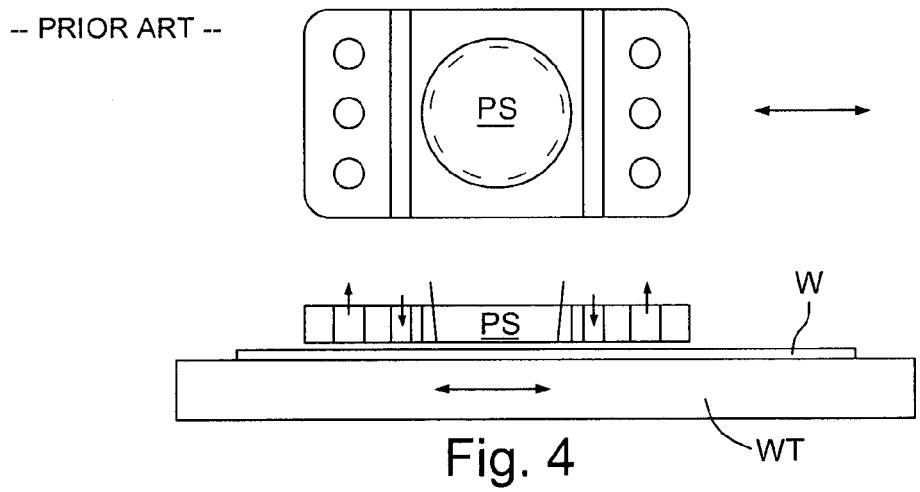
FIG. 4 depicts a further liquid supply system for use in a lithographic projection apparatus.

A further immersion lithography solution with a localized liquid supply system is shown in FIG. 4. Liquid is supplied by two groove inlets on either side of the projection system PS and is removed by a plurality of discrete outlets arranged radially outwardly of the inlets. The inlets and outlets can be arranged in a plate with a hole in its centre and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlets to use can depend on the direction of movement of the substrate W (the other combination of inlet and outlets being inactive). Note that the direction of flow of the liquid is shown by arrows in FIG. 4.

Figure 5:
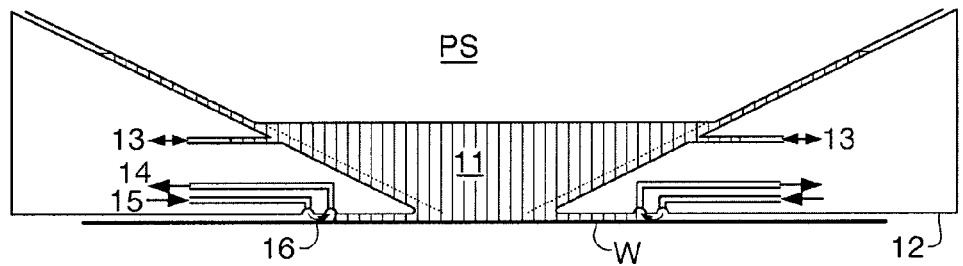
FIG. 5 depicts a further liquid supply system for use in a lithographic projection apparatus.

Another arrangement which has been proposed is to provide the liquid supply system with a liquid confinement member which extends along at least a part of a boundary of the space between the final element of the projection system and the underlying surface of the substrate, substrate table or both. Such an arrangement is illustrated in FIG. 5. The immersion system has a localized liquid supply system with a liquid confinement structure, which supplies liquid to a limited area of, for example, a substrate.

FIG. 5 schematically depicts a localized liquid supply system or fluid handling structure with a barrier member 12, which extends along at least a part of a boundary of the space between the final element of the projection system and the substrate table WT or substrate W. (Please note that reference in the following text to surface of the substrate W also refers in addition or in the alternative to a surface of the substrate table, unless expressly stated otherwise.) The barrier member 12 is substantially stationary relative to the projection system in the XY plane though there may be some relative movement in the Z direction (in the direction of the optical axis). In an embodiment, a seal is formed between the barrier member and the surface of the substrate W and may be a contactless seal such as a gas seal or fluid seal.

The barrier member 12 at least partly contains liquid in the space 11 between a final element of the projection system PL and the substrate W. A contactless seal 16 to the substrate W may be formed around the image field of the projection system so that liquid is confined within the space between the substrate W surface and the final element of the projection system PL. The space is at least partly formed by the barrier member 12 positioned below and surrounding the final element of the projection system PL. Liquid is brought into the space below the projection system and within the barrier member 12 by liquid inlet 13. The liquid may be removed by liquid outlet 13. The barrier member 12 may extend a little above the final element of the projection system. The liquid level rises above the final element so that a buffer of liquid is provided. In an embodiment, the barrier member 12 has an inner periphery that at the upper end closely conforms to the shape of the projection system or the final element thereof and may, e.g., be round. At the bottom, the inner periphery closely conforms to the shape of the image field, e.g., rectangular, though this need not be the case.

The liquid is contained in the space 11 by a gas seal 16 which, during use, is formed between the bottom of the barrier member 12 and the surface of the substrate W. The gas seal is formed by gas, e.g. air or synthetic air but, in an embodiment, $N_2$ or another inert gas. The gas in the gas seal is provided under pressure via inlet 15 to the gap between barrier member 12 and substrate W. The gas is extracted via outlet 14. The overpressure on the gas inlet 15, vacuum level on the outlet 14 and geometry of the gap are arranged so that there is a high-velocity gas flow 16 inwardly that confines the liquid. The force of the gas on the liquid between the barrier member 12 and the substrate W contains the liquid in a space 11. The inlets/outlets may be annular grooves which surround the space 11. The annular grooves may be continuous or discontinuous. The flow of gas 16 is effective to contain the liquid in the space 11. Such a system is disclosed in United States patent application publication no. US 2004-0207824, which is hereby incorporated by reference in its entirety.

An embodiment of the invention relates to a particular type of extractor for use in a fluid handling structure which substantially prevents the meniscus from advancing beyond a certain point. That is, an embodiment of the invention relates to a meniscus pinning device which pins the edge of liquid in a space between the final element of the projection system and the substrate and/or substrate table substantially in place. The meniscus pinning arrangement relies on the so-called gas drag extractor principle which has been described, for example, in U.S. patent application publication no. 2008/0212046, which is hereby incorporated by reference in its entirety. In that system the extraction holes may be placed in a cornered shape. The corners are aligned with the stepping and scanning directions. This helps reduce the force on the meniscus between two outlets for a given speed in the step or scan direction compared to a case where the two outlets are aligned perpendicular to the direction of scan. However, an embodiment of the invention may be applied to a fluid handling system which in plan has any shape, or has a component such as the extraction openings arranged in any shape, such as a closed shape. Such a closed shape in a non-limiting list may include an ellipse (such as a circle), a rectilinear shape (such as a rectangle, e.g. a square, or parallelogram, e.g., a rhombus) or a cornered shape with more than four corners (such as a four or more pointed star).

In a variation of the system of US 2008/0212046, to which an embodiment of the invention relates, the geometry of the cornered shape in which the openings are arranged allows sharp corners (selected from the range of about 60° to 90°, desirably the range of 75° to 90° and most desirably the range of 75° to 85°) to be present for the corners aligned both in the scan and in the stepping directions. This may allow increased speed in the direction of each aligned corner. This is because the creation of liquid droplets due to an unstable meniscus in the scanning direction is reduced. Where corners are aligned with both the scanning and stepping directions, increased speed may be achieved in those directions. Desirably the speed of movement in the scanning and stepping directions may be substantially equal.

Figure 6:
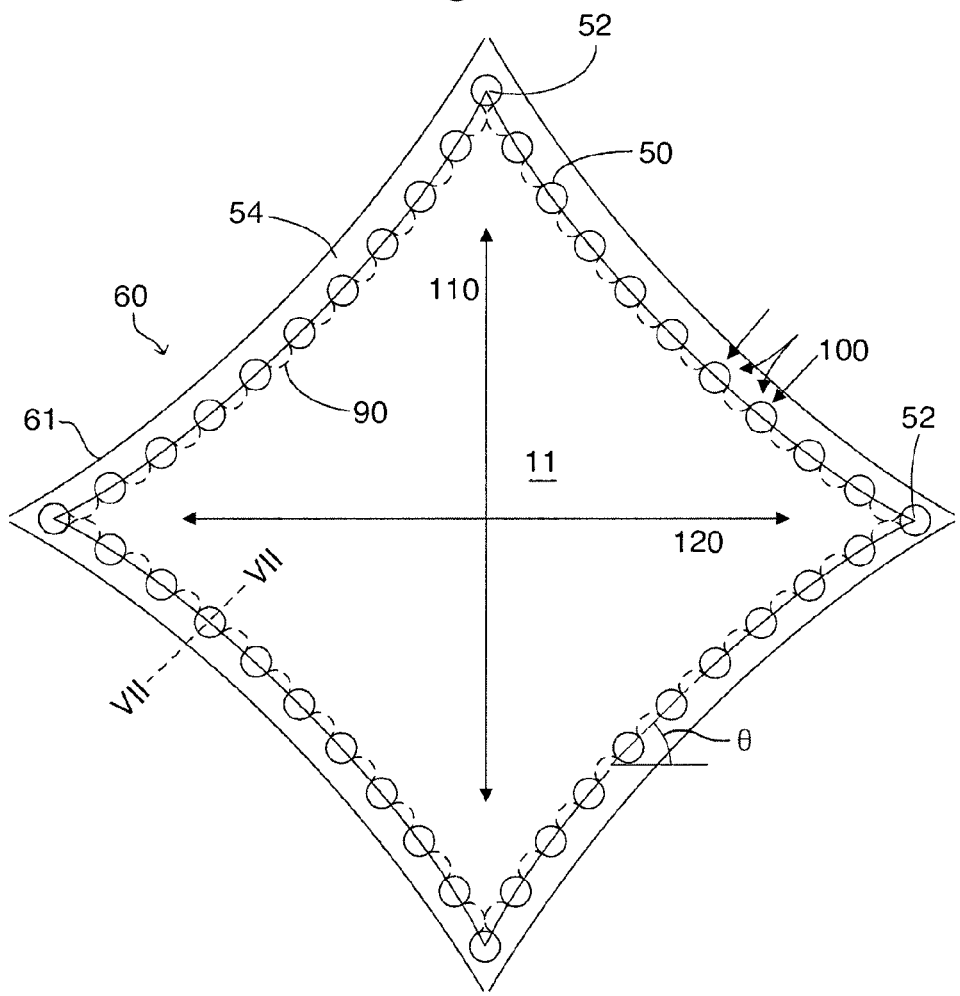
FIG. 6 is a schematic illustration, in plan, of a meniscus pinning system according to an embodiment of the invention.

FIG. 6 illustrates schematically and in plan the meniscus pinning features of a fluid handling structure or system of an embodiment of the invention. The features of a meniscus pinning device are illustrated which may, for example, replace the meniscus pinning arrangement 14, 15, 16 of FIG. 5. The meniscus pinning device of FIG. 6 comprises a plurality of discrete openings 50. Each of these openings 50 are illustrated as being circular though this is not necessarily the case. Indeed one or more of the openings 50 may be one or more selected from a circle, square, rectangular, oblong, triangular, an elongate slit, etc. Each opening has, in plan, a length dimension (i.e. in the direction from one opening to the adjacent opening) of greater than 0.2 mm, desirably greater than 0.5 mm or 1 mm, in an embodiment selected from the range of 0.1 mm to 10 mm, in an embodiment selected from the range of 0.25 mm to 2 mm. In an embodiment the length dimension is selected from the range of 0.2 mm to 0.5 mm, desirably the range of 0.2 mm to 0.3 mm. In an embodiment, the width of each opening is selected from the range of 0.1 mm to 2 mm. In an embodiment, the width of each opening is selected from the range of 0.2 mm to 1 mm.

Each of the openings 50 of the meniscus pinning device of FIG. 6 may be connected to a separate under pressure source. Alternatively or additionally, each or a plurality of the openings 50 may be connected to a common chamber or manifold (which may be annular) which is itself held at an under pressure. In this way a uniform under pressure at each or a plurality of the openings 50 may be achieved. The openings 50 can be connected to a vacuum source and/or atmosphere surrounding the fluid handling structure or system (or barrier member or liquid supply system) may be increased in pressure to generate the desired pressure difference.

In the embodiment of FIG. 6 the openings are fluid extraction openings. That is they are inlets for the passage of gas and/or liquid into the fluid handling structure. That is, the inlets may be considered as outlets from the space 11. This will be described in more detail below.

The openings 50 are formed in a surface of a fluid handling structure 12. That surface faces the substrate and/or substrate table, in use. In one embodiment the openings are in a flat surface of the fluid handling structure. In another embodiment, a ridge may be present on the bottom surface of the substrate member. In that embodiment the openings may be in the ridge. In an embodiment, the openings 50 may be defined by needles or tubes. The bodies of some of the needles, e.g., adjacent needles, may be joined together. The needles may be joined together to form a single body. The single body may form the corner shape.

Figure 7:
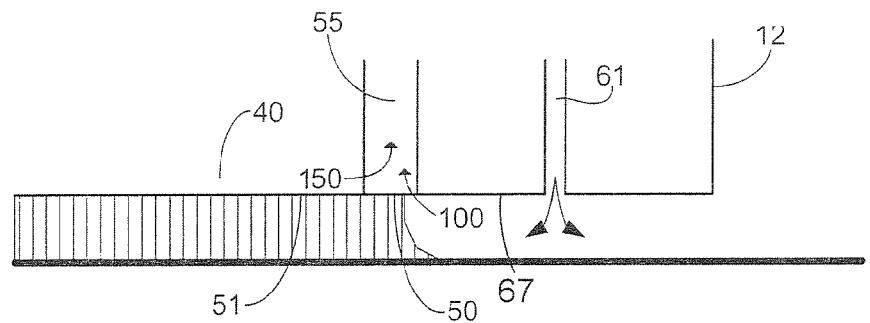
FIG. 7 depicts, in cross-section at line VII-VII in FIG. 6 in a plane substantially parallel to the optical axis of the projection system, a meniscus pinning system according to an embodiment of the invention.

As can be seen from FIG. 7, the openings 50 are the end of a tube or elongate passageway 55, for example. Desirably the openings are positioned such that they face the substrate W in use. The rims (i.e. outlets out of a surface) of the openings 50 are substantially parallel to a top surface of the substrate W. The openings are directed, in use, towards the substrate and/or substrate table configured to support the substrate. Another way of thinking of this is that an elongate axis of the passageway 55 to which the opening 50 is connected is substantially perpendicularly (within +/−45°, desirably within 35°, 25° or even 15° from perpendicular) to the top surface of the substrate W.

Each opening 50 is designed to extract a mixture of liquid and gas. The liquid is extracted from the space 11 whereas the gas is extracted from the atmosphere on the other side of the openings 50 to the liquid. This creates a gas flow as illustrated by arrows 100 and this gas flow is effective to pin the meniscus 90 between the openings 50 substantially in place as illustrated in FIG. 6. The gas flow helps maintain the liquid confined by momentum blocking, by a gas flow induced pressure gradient and/or by drag (shear) of the gas flow on the liquid.

The openings 50 surround the space to which the fluid handling structure supplies liquid. That is, the openings 50 may be distributed in an undersurface of the fluid handling structure. The openings may be substantially continuously spaced around the space (although the spacing between adjacent openings 50 may vary). In an embodiment, liquid is extracted all the way around the closed shape, e.g. cornered shape, and is extracted substantially at the point at which it impinges on the cornered shape. This is achieved because the openings 50 are formed all the way around the space (in the cornered shape). In this way the liquid may be confined to the space 11. The meniscus may be pinned by the openings 50, during operation.

As can be seen from FIG. 6, the openings 50 are positioned so as to form, in plan, a cornered shape (i.e. a shape with corners 52). In the case of FIG. 6 this is in the shape of a square with curved edges or sides 54. The edges 54 have a negative radius. The edges 54 curve towards the center of the cornered shape in areas away from the corners 52.

The square has principal axes 110, 120 aligned with the major directions of travel of the substrate W under the projection system. This helps ensure that the maximum scan speed is faster than if the openings 50 were arranged in a circular shape. This is because the force on the meniscus between two openings 50 is reduced with a factor cos θ. Here θ is the angle of the line connecting the two openings 50 relative to the direction in which the substrate W is moving.

The use of a square shape allows movement in the step and scanning directions to be at a substantially equal maximum speed. This may be achieved by having each of the corners 52 of the shape aligned with the scanning and stepping directions 110, 120. If movement in one of the directions, for example the scan direction is preferred to be faster than movement in the step direction then a rhombus shape could be used. In such an arrangement the primary axis of the rhombus may be aligned with the scan direction. For a rhombic shape, although each of the corners may be acute, the angle between two adjacent sides of the rhombus, for example in the stepping direction, may be obtuse, i.e. more than 90° (for example selected from the range of about 90° to 120°, in an embodiment selected from the range of 90° and 105°, in an embodiment selected from the range of 85° and 105°).

Throughput can be optimized by making the primary axis of the shape of the openings 50 aligned with the major direction of travel of the substrate (usually the scan direction) and to have a second axis aligned with the other major direction of travel of the substrate (usually the step direction). It will be appreciated that any arrangement in which 0 is different to 90° will give an advantage in at least one direction of movement. Thus, exact alignment of the principal axes with the major directions of travel is not vital.

An advantage of providing the edges with a negative radius is that the corners may be made sharper. An angle of selected from the range of 75 to 85° or even lower may be achievable for both the corners 52 aligned with the scan direction and the corners 52 aligned with the step direction. If it were not for this feature then in order for the corners 52 aligned in both directions to have the same angle, those corners would have to have 90°. If less than 90° were desired it would be necessary to select one direction to have corners with less than 90° with the result that the other corner would have an angle of greater than 90°.

As will be described in relation to FIGS. 13 and 15, it would be possible to have the openings in a star shape in which instead of providing curved edges the edges are straight but meet at a point which lies radial inwardly of a straight line between two corners. However, this arrangement may not be as successful as the case where the line joining the openings is smooth, i.e. where a line defined by the openings 50 and defining the cornered shape is continuous and has a continuously changing direction. In the star shape embodiment, the corner along the side of the shape will pin the meniscus. For a sharp corner the forces pinning the meniscus are focused on the corner, i.e. a short length of the edge of the shape. A more smoothly curved corner, for example, one with a large radius of curvature, distributes the pinning forces along a longer length of the curve of a corner i.e. around the corner. Thus, for a certain relative velocity between the substrate and the fluid handling structure, the effective meniscus pinning force applied to both corners is the same. However, for a defined length of the edge, the effective pinning force for the sharp corner is more than for the smoothly curved corner. This makes the meniscus pinned at a sharp corner unstable at a lower relative velocity between the substrate and the fluid handling structure than a meniscus pinned by the smoothly curved corner.

Each of the openings 50 is illustrated as being circular though this is not necessarily the case. Indeed one or more of the openings 50 may be one or more selected from a circle, square, rectangular, oblong, triangular, an elongate slit, etc. Each opening has, in plan, a length dimension (i.e. in the direction from one opening to the adjacent opening) of greater than 0.2 mm, desirably greater than 0.5 mm or 1 mm, in an embodiment selected from the range of 0.1 mm to 10 mm, in an embodiment selected from the range of 0.25 mm and 2 mm. In an embodiment the length dimension is selected from the range of 0.2 mm to 0.5 mm, desirably selected from the range of 0.2 mm to 0.3 mm. In an embodiment, the width of each opening selected from the range of 0.1 mm to 2 mm. In an embodiment the width of each opening is selected from the range of 0.2 mm to 1 mm.

FIG. 7 illustrates that the opening 50 is provided in a bottom surface 40 of the fluid handling structure. This is however not necessarily the case and the openings 50 may be in a protrusion from the bottom surface of the fluid handling structure. Arrow 100 shows the flow of gas from outside of the fluid handling structure into the passageway 55 associated with the opening 50 and the arrow 150 illustrates the passage of liquid from the space into the opening 50. The passageway 55 and opening 50 are desirably designed so that two phase extraction (i.e. gas and liquid) desirably occurs in an annular flow mode in which gas substantially flows through the center of the passageway 55 and liquid substantially flows along the walls of the passageway 55. This results in smooth flow with low generation of pulsations.

There may be no meniscus pinning features radially inwardly of the openings 50. The meniscus is pinned between the openings 50 with drag forces induced by gas flow into the openings 50. A gas drag velocity of greater than about 15 m/s, desirably 20 m/s is sufficient. The amount of evaporation of liquid from the substrate may be reduced thereby reducing both splashing of liquid as well as thermal expansion/contraction effects.

At least, for example, thirty-six (36) discrete needles each with a diameter of 1 mm and separated by 3.9 mm may be effective to pin a meniscus. In an embodiment, 112 openings 50 are present. The openings 50 may be square, with a length of a side of 0.5 mm, 0.3 mm, 0.2 mm or 0.1 mm. The total gas flow in such a system is of the order of 100 l/min. In an embodiment the total gas flow is selected from the range of 70 l/min to 130 l/min.

Other geometries of the bottom of the fluid handling structure are possible. For example, any of the structures disclosed in U.S. patent application publication no. US 2004-0207824 could be used in an embodiment of the invention.

As can be seen in FIG. 6, an aperture 61 is provided outside the openings 50. The aperture 61 may be substantially parallel to the lines joining the openings 50. The aperture 61 may be elongate and may be in the form of a slit. In an embodiment a series of discrete apertures 61 may be provided along a side 54 of the shape. In use, the elongate aperture 61 (or plurality of apertures 61) is connected to an over pressure source and forms a gas knife 60 surrounding the meniscus pinning system formed by openings 50. The function of this gas knife will be described below.

When a substrate table moves so that the meniscus of the immersion liquid crosses a lyophilic region, or a region of relatively low lyophobicity (i.e. having a lower contact angle to the immersion liquid than other parts of the substrate or substrate table surface), in a liquid handling device as described hereinabove but lacking the gas knife 60, immersion liquid may spread out into a film over the region of low lyophobicity. Formation of a film may depend on whether the speed of relative movement of the liquid meniscus and substrate or substrate table ("scan speed") is greater than a critical speed. With respect to a meniscus pinned by the openings 50, the critical speed is the relative velocity between the fluid handling structure 12 and the facing surface of a substrate and/or substrate table above which the meniscus may be no longer stable. The critical speed depends on one or more properties of the facing surface. The higher the contact angle of the surface the higher the critical speed in general. Once a film has begun to form, it may continue to grow even if the substrate has now moved so that the meniscus is over an area with a higher contact angle such that the critical speed is higher for the area than the scan speed at that time. The film may, in some cases after a short delay, break up into large droplets which are undesirable. In some cases, subsequent movements of the substrate table may cause the droplets to collide with the meniscus, which may generate bubbles in the immersion liquid. Regions having a relatively low lyophobicity may include the edge of the substrate, a removable feature (e.g. a sticker) on the substrate table, a positioning feature (e.g. an encoder grid) and a sensor (e.g. a dose sensor, an image sensor or a spot sensor). In an embodiment, a region of relatively low lyophobicity may be formed by degradation of a coating or surface treatment. The coating or surface treatment may be provided to increase the lyophobicity of the surface on which it is provided.

The gas knife 60 in an embodiment of the invention functions to reduce the thickness of any liquid film left on the substrate or substrate table so that it does not break into droplets but rather the liquid is driven towards the openings 50 and extracted. In an embodiment the gas knife 60 operates to help prevent the formation of a film. To achieve this, it is desirable that the distance between the center lines of the gas knife and the meniscus pinning openings 50 is selected from the range of 1.5 mm to 4 mm, desirably from the range of 2 mm to 3 mm. The line along which apertures 61 (or elongate aperture 61) is arranged generally follows the line of the openings 50 so that the distance between adjacent ones of the apertures 61 (or elongate aperture 61) and openings 50 is within the aforementioned ranges. At a point on the line of openings, the direction of the line of apertures 61 (or elongate aperture 61) is parallel to the line of the openings 50. When the line of opening is a straight line, the line of openings 50 may be parallel to the line of apertures 61 (or elongate aperture 61). Where the line of openings 50 is curved, the line of apertures 61 (or elongate aperture 61) may be curved. The line of openings and the line of apertures 61 (or elongate aperture 61) may form the outline of similar shapes of dissimilar size. It is desirable to maintain a constant separation between adjacent ones of the apertures 61 (or elongate aperture 61) and openings 50. In an embodiment this is desirable along the length of each center line of the gas knife. In an embodiment the constant separation may be in the region of one or more corners of the fluid handling, device.

The gas knife is desirably close enough to the openings 50 to create a pressure gradient across the space between them. There is desirably no stagnant zone in which a layer of liquid, or liquid droplets can accumulate. In an embodiment, the continuous lower surface of barrier member 12 forms a damper 67 which assists in creating the pressure gradient. The lower surface is desirable substantially parallel to the opposing surface of the substrate or substrate table. In an embodiment, the presence of the damper allows the openings 50 to be arranged in a different or dissimilar shape from that of the gas knife apertures 61 (or elongate aperture 61). For example, the shape formed by the openings 50 may be a star and the apertures 61 (or elongate aperture 61) of the gas knife may form a square. In an embodiment the gas knife apertures 61 (or elongate aperture 61) may form an ellipse, having its major and minor axes of different lengths, and the openings 50 may form a circle.

In an embodiment, a controller 63 is provided to help ensure that the rate of flow of gas through the gas knife 60 is selected from the range of 100 l/min to 200 l/min for a gas knife of length selected from the range of 200 mm to 400 mm. In an embodiment, the controller also controls the rate of flow of gas through the openings 50 to be substantially the same as the gas flow rate through gas knife 60. The gas flow rate from the gas knife 60 may be coupled to the gas flow through the openings 50. In an embodiment the gas flow rate through the gas knife is up to or equal to 20% or up to or equal to 10% different than the total flow rate through the openings 50. In an embodiment the gas flow rate through the gas knife is about 10% greater than the total flow rate through the openings 50. This means that substantially all the gas flowing out of the gas knife flows into the openings 50. Whereas an isolated gas knife generates a substantially symmetric pressure peak, with gas flows in both directions away from that peak, because the gas flows are balanced in an embodiment, the gas knife 60 instead forms a pressure gradient between the gas knife 60 and meniscus pinning openings 50. There is little or no gas flow outwardly (rightwards in FIG. 7) of the gas knife 60. The controller controls the overpressure source (e.g. a pump) and/or the underpressure source (e.g. a pump, possibly the same pump as provides the overpressure) to achieve the desired flow rates.

In an embodiment, the controller controls activation of the gas knife 60 so that it is active when it is, or may be, required. In other words, the gas knife 60 is switched off when the scan speed is safely below the critical speed and is switched on when the scan speed goes above, or is likely to go above, the critical speed for the surface currently under the meniscus or approaching the meniscus.

A conventional gas knife outside the meniscus pinning device of a fluid handling system can act as a "bulldozer", collecting liquid remaining on the substrate and substrate table until it forms large droplets that can break through the gas knife or collide with the meniscus. Such large droplets may generate bubbles when colliding with the meniscus. The gas knife arrangement in an embodiment of the invention does not act in this way. Instead it prevents any film left behind on the substrate at the trailing edge of the liquid handling device growing thick enough to break into droplets. The excess liquid is driven back towards the openings 50. At the leading edge of the liquid handling structure any liquid films or droplets left on the substrate or substrate table are similarly driven towards the openings 50. This liquid can be extracted through the openings 50 without creating bubbles by collisions with the meniscus. Therefore, a high scanning speed may be maintained. It is believed that the improved effect arises because a continuous pressure gradient between the gas knife and the openings 50 is created rather than a pressure peak opposite the exit of the gas knife.

Desirably, there are no openings in the underside of the barrier member 12 between the openings 50 and the aperture 61. The bottom surface of the barrier member is desirably smooth and/or continuous between the openings 50 and the aperture 61.

Various different arrangements of the meniscus pining openings are described below with reference to FIGS. 8 to 15. The openings 50 may also be arranged in other shapes, e.g. a square, rectangle or circle. In each case the gas knife device 60 has substantially or exactly the same shape as the arrangement of openings 50, so that the separation between the opening 50 and gas knife 60 is within the aforementioned ranges and is desirably constant.

Figure 8:
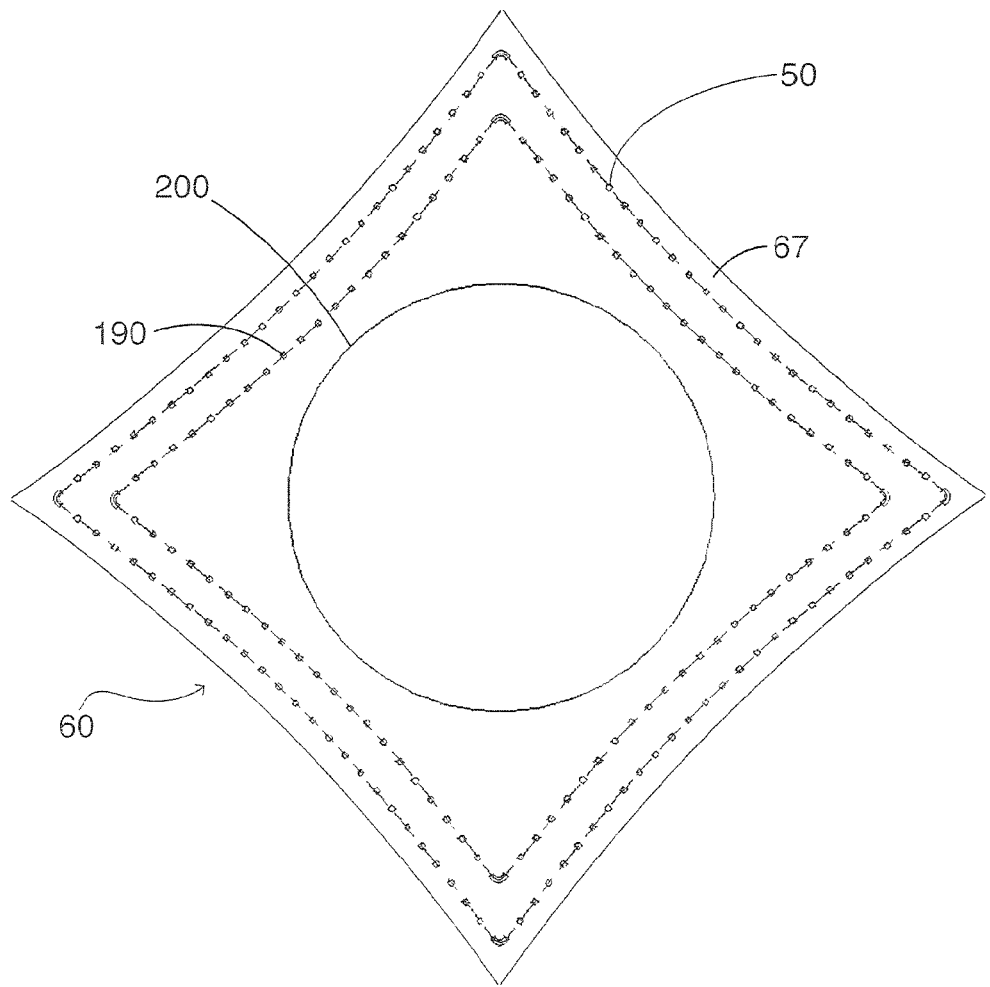
FIG. 8 illustrates, in plan, a practical embodiment of a fluid handling structure according to an embodiment of the invention.

FIG. 8 illustrates, in plan, a practical embodiment of the invention. In FIG. 8, the openings 50 are provided in a similar cornered shape to that of FIG. 6. However, in FIG. 8, a slightly different geometry is present. That is, the openings 50 are denser and are smaller in diameter. In the FIG. 8 embodiment there are 27 openings per edge. In an embodiment the length of each edge is selected from the range of 50 mm to 90 mm. Each of the openings 50 is approximately square in shape, with each side having a length of 0.5 mm.

As with the embodiment of FIG. 6, there is an opening present at the apex of each corner in the embodiment of FIG. 8. This helps ensure that the top opening 50 of a corner 52 has an adjacent opening on each side which is in a direction which is not perpendicular to the direction of scan or step. If two openings 50 were equally spaced on each side of the apex of the corner, the line between those two openings 50 would be perpendicular to the scan or step direction resulting in full force on the meniscus of liquid between those two openings 50. In an embodiment, each corner has a radius selected from the range of 0.05 mm to 4.0 mm. In an embodiment, the radius is selected from the range of 0.5 mm to 4.0 mm. In an embodiment, the radius is selected from the range of 1 mm to 3 mm, or selected from the range of 1.5 mm to 2.5 mm. If the radius is too large, this can decrease the liquid containment performance because instabilities in the meniscus can form resulting in leaking. Although a sharp corner (with no radius at all), does not have a decrease in containment performance, a very small radius of corner may result in a less stable meniscus. Desirably the cornered shape has at least one such smoothly curved corner. In one embodiment, the corner may have no radius or a radius selected from the range of 0 mm to 4.0 mm.

The negative radius of each edge is desirably zero or less. The negative radius is chosen depending upon the desired angle at the corner (60-90°) and the distance between the corners (50 mm-150 mm in one embodiment). The sides with a negative radius therefore change direction, along at least part of their length, in a continuous way. That is, there is no step change in direction. An alternative way of seeing it is that a line intersecting the openings 50 is smooth. This helps ensure that an advantage of a corner angle in the desired range can be achieved. It will be appreciated that if too small a radius is used, that the tangent between two openings 50 close to the corner not aligned with the direction of travel will be closer to perpendicular to the direction of travel than for the case of a straight edge. However, the effect of a sharp corner more than compensates for this drawback.

In an embodiment, the cornered shape of the openings has four corners and four sides, each side having a negative radius of curvature. However, it may be appropriate to have other cornered shapes. For example, an eight sided shape may have an advantage, for example to improve scan speed with limited layout space. The embodiments of FIGS. 13 and 15 can be regarded as being eight sided.

In FIG. 8 a central opening 200 is illustrated. This central opening 200 defines the space in which the immersion fluid 11 is confined. In the FIG. 8 embodiment, the central opening is circular, in plan. However, other shapes may be used, for example a shape which is the same as the closed shape formed by the openings 50. In an embodiment the shape of the central opening may have the same shape in plan as further openings 190 through which liquid is supplied beneath the fluid handling structure. Other shapes may also be suitable. This applies to all embodiments.

The further openings 190 may have a similar linear arrangement as the closed shape formed by the openings 50, the gas knife aperture(s) 61, or both. The further openings 190 may be located within the shape formed by the openings 50. It is desirable that the distance between the center lines of the gas knife aperture(s) 61 and the adjacent further openings 190 is maintained at a substantially constant separation along the center line of the gas knife aperture(s) 61. In an embodiment the constant separation is along a part of the gas knife center line, for example in the region of the corners. In an embodiment, for example at a point on the line of gas knife aperture(s) 61, the line of the gas knife aperture(s) 61 is substantially parallel to the line of the openings 190.

FIGS. 9 to 12 illustrate several different embodiments of a cornered shape for the openings 50. Each cornered shape has at least a portion of at least one edge which has a negative radius of curvature. However each edge also has a portion with a positive radius of curvature. The apex of the portions with a positive radius can be seen as being corners so that the shapes are eight sided or cornered shapes. This results in each of the shapes having a central portion or corner 59 along each edge. The central portion or corner 59 may be closer to a straight line 58 joining two corners 52 than other parts of the edge. The central portion or corner 59 may be radially outwards from the straight line more than other portions. The straight line 58 may be considered an imaginary line as it is not present, but it is a line which is placed to connect two adjacent corners 52.

Figure 9:
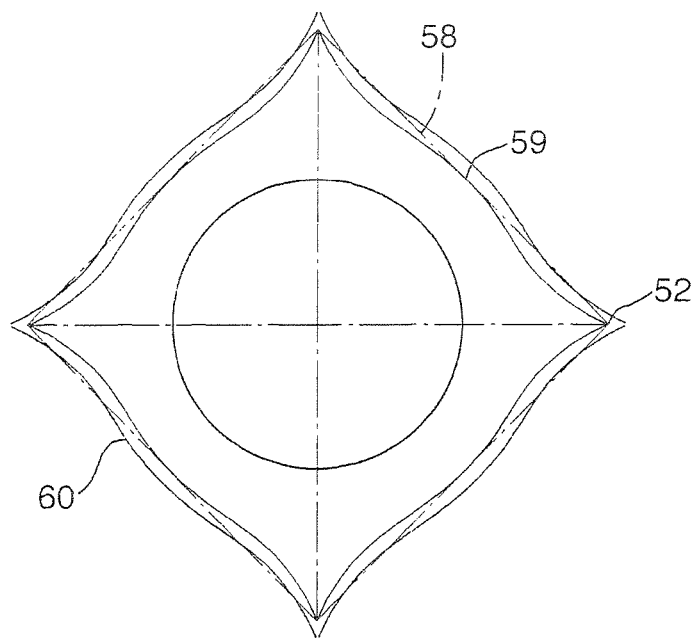
FIGS. 9 to 15 illustrate various variations on the embodiment of FIG. 8.

In FIG. 9, the central portion 59 protrudes so that it actually lies on the straight line 58 between two corners 52.

Figure 10:
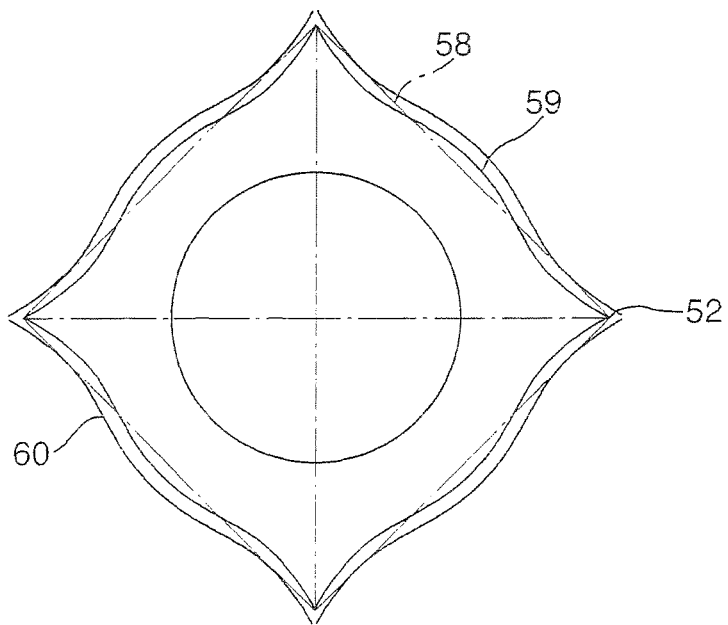
Figure 11:
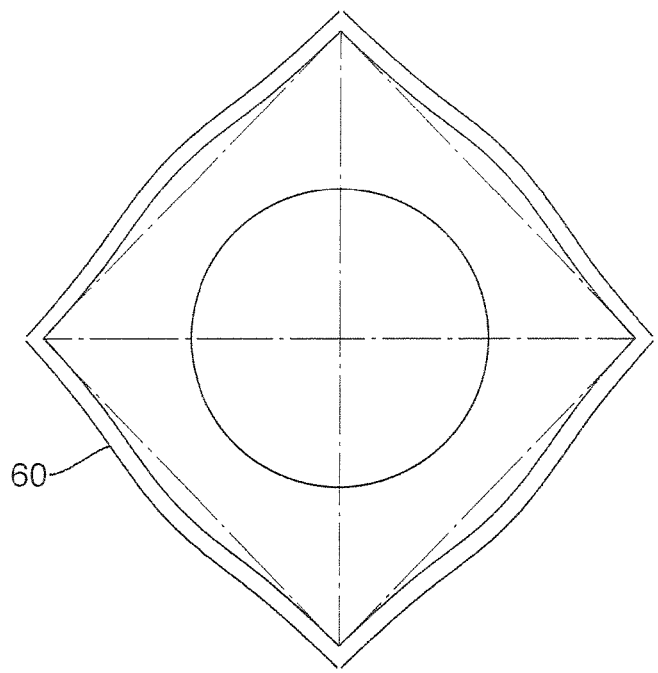
Figure 12:
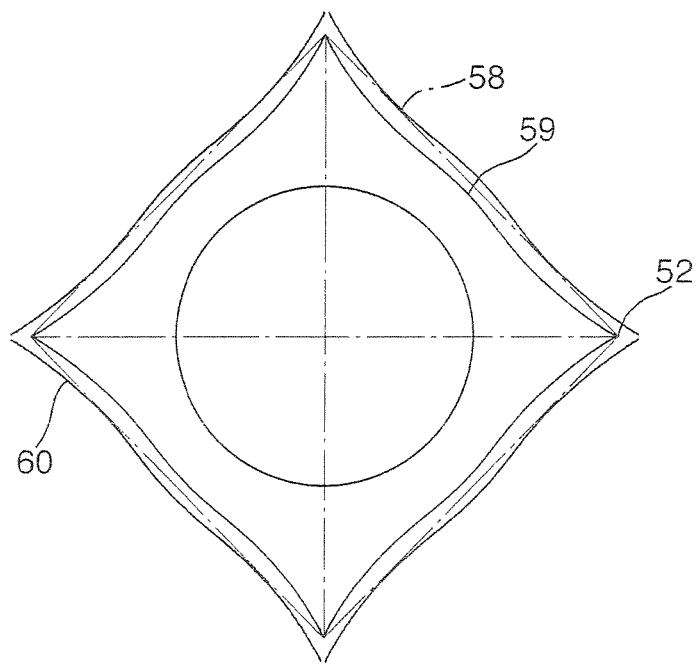

In FIG. 10, the central portion 59 extends beyond the straight line 58 between two corners 52 so that it is radially further from the central axis than the straight line 58. In FIG. 11, all of the edge is radially further away from the central axis than the straight line 58. The FIG. 11 embodiment is a shape of minimal magnitude of negative radius, i.e. substantially zero. This embodiment is useful if the space for the shape is limited. In FIG. 12, this is similar to the embodiment of FIG. 9 except that the central portion 59 does not quite protrude far enough so that it is closer to the central axis than the imaginary straight line 58 between two corners 52. This demonstrates a large magnitude of negative radius.

Figure 13:
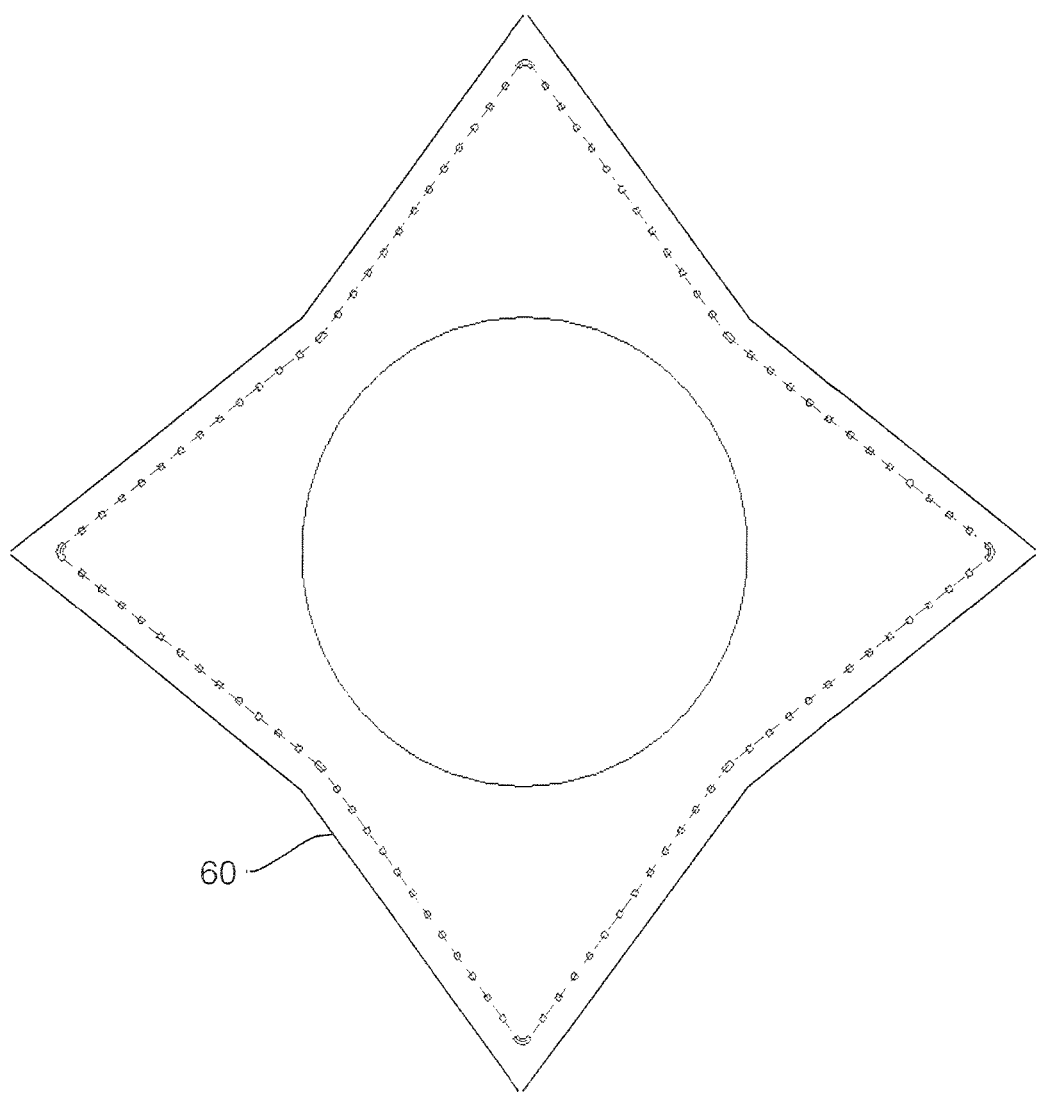

FIG. 13 illustrates an embodiment which is similar to that of FIG. 8. Each of the corners 52 have edges which protrude radially inwardly from the straight line between two adjacent corners 52. However, in FIG. 13 the edges each have two straight portions (and no curved portions). The straight portions converge to a point which is radially inwardly of the straight line between two corners 52. Therefore the change in direction of the edge is abrupt (i.e. is at a point) compared to the embodiment of FIG. 8 where the change in direction is continuous. This shape may have a meniscus, especially at the point radially inward of the straight line, which is less stable than a meniscus pinned by a shape with a smoothly curved edge.

Figure 14:
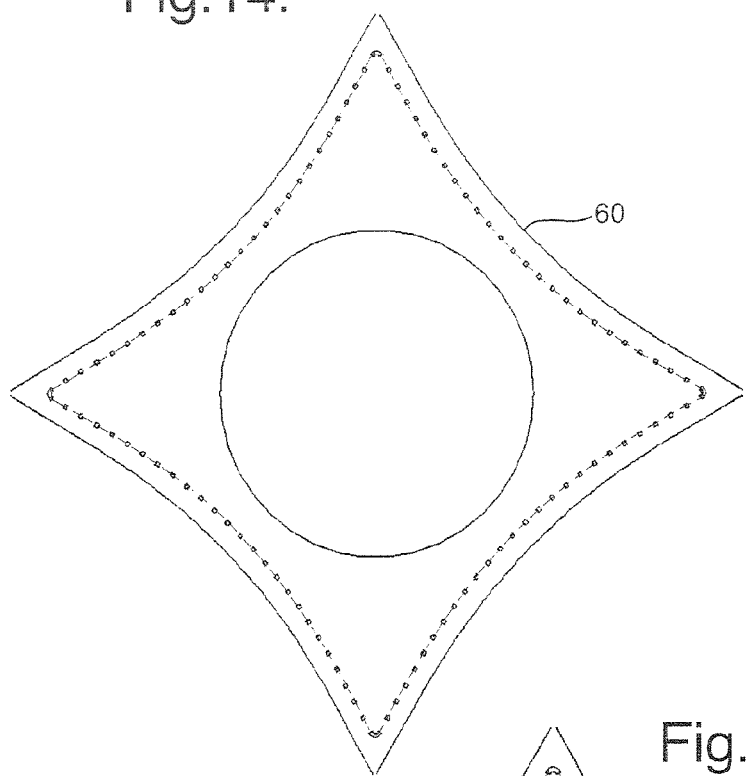
Figure 15:
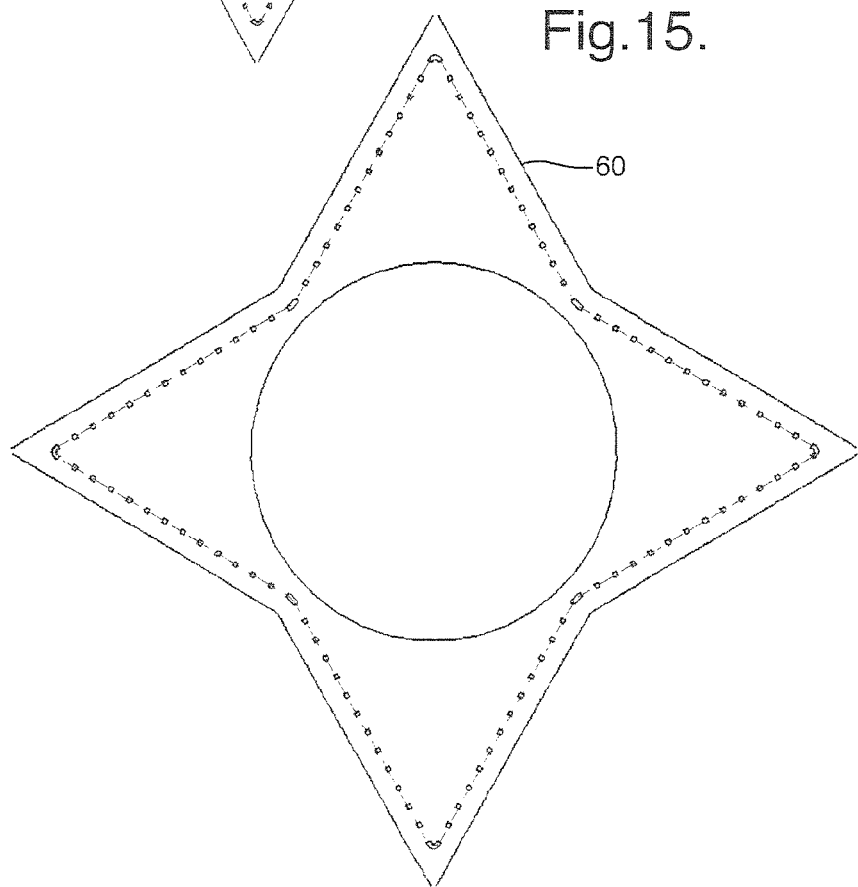

FIGS. 14 and 15 illustrate an embodiment similar to that of FIGS. 8 and 13 respectively except that the angle of each corner is 60° as opposed to 75° of FIGS. 8 and 13. This illustrates that it is possible for an embodiment of the invention to have different angles at the corner. However, the best performance may be achieved with a corner with an angle selected from the range of 60° to 90°, or selected from the range of 75° to 90°, or selected from the range of 75° to 85°.

In the above mentioned description, the gas knife 60 may have an aperture 61 which is discontinuous. The gas knife may have a plurality of apertures 61. An aperture 61 may follow a straight path with a small if minimal curvature. So that, to accommodate a change in direction, a discontinuity is present in the gas knife so that it has at least two openings, each aligned in a different direction, either side of a location where the gas knife changes direction, e.g. at a corner 44. However, as shown in FIG. 16 a gas knife may have continuous aperture at a corner. Therefore where a gas knife 60 changes direction, a single aperture 61 may be used with a linear aperture which curves, having an aperture corner 44. The continuous aperture may have any shape with pointed, sharp and/or rounded corners 44. In an embodiment, the gas knife aperture 61 may form a closed shape, such as a square or a four pointed star as shown in FIG. 17. The continuous gas knife aperture may be present in any of the embodiments described with reference to FIGS. 6 to 15.

In an embodiment of a fluid handling structure 12, the gas knife 60 has a similar, but larger shape in plan as the shape formed in plan by the openings 50 as shown in FIG. 18. As described herein the shapes formed by the openings 50 and of the gas knife 61 may have one or more weak sections 64. A weak section 64 has a lower critical scan speed relative to the other parts of the periphery of the shape. The periphery may correspond to the cornered shape defined by the gas knife aperture(s) 61 and/or the openings 50. See, e.g., U.S. Patent Application Publication No. 2010/0085545, which is hereby incorporated by reference in its entirety. At each of the weak sections once the corresponding critical scan speed is achieved there is a risk of meniscus instability and droplet loss. A droplet lost from the meniscus may have one or more of the effects as described herein.

A location of a weak section may be at a corner 44 of a gas knife 60 or a corner 52 of the shape defined by the openings 50. A weak portion 64 formed by a part of the periphery of the shape formed by the openings 50, or be part of the periphery of the shape formed by the gas knife aperture(s) 61, between the respective corners 44, 52. Such a location may be: part of an edge 71 of the gas knife 60; or part of an edge 54 of the shape defined by the openings 50. The part of the edge 54, 71 may have at least a portion with negative radius of curvature or corner 66 which may correspond to an obtuse angle in the edge 54, 71. The negative radius of curvature may be at a midpoint of the edge 54, 71, between two adjacent corners 44, 52. In an embodiment the portion with the negative radius of curvature has a curvature which is so large, and/or so smoothly changing, that the corner 66 may be almost imperceptible. In such a case reference herein to the corner 66 may include reference to the midpoint of the portion of the negative radius of curvature and/or the edge 54, 71.

To decrease the chance of droplet loss at a weak portion 64 the operational critical scan speed for the portion may be increased. This may be achieved by increasing a dimension of the damper 67, e.g. a damper width 68. The damper width 68 may defined with respect to the direction of movement at which the critical scan speed is lowest. Increasing the damper width means that, at a specific scan speed, the duration the liquid takes to pass under the damper increases. As the gas flow from the gas knife 60 to the openings 50 passes under the damper, the gas flow has an increased amount of time (as compared to a shorter damper) in which to stop the droplet. Otherwise the droplet may travel in the direction of movement (e.g. scan direction) beyond the damper and the gas knife aperture(s) 61. A broader damper increases the exposure time of a droplet to the gas knife flow.

FIG. 19 shows an embodiment of fluid handing system 12 in which the damper width 68 is increased in the region of the corner 66 situated on an edge of the cornered shape. The gas knife aperture(s) 61 has a square shape and the cornered shape of the openings 50 is rhomboidal, e.g. square. Such an arrangement may increase the critical scan speed in a direction which is not aligned with the major directions of travel of, for example, scanning and stepping. The scan speed in a direction angled relative to scanning, stepping or both may be increased. The arrangement is desirable since, for the weak section 64, it may provide a significant increase in critical scan speed of the whole fluid handling structure 12.

Although the damper width is increased at the corner 66, the corners 44, 52 aligned with the major directions of travel, e.g. scanning and stepping, may have a damper width 69 which may limit the maximum scan speed which could be achieved with a stable meniscus (i.e. without substantially any droplet loss). That is, a small damper width 69 at a corner 44, 52 may limit the critical scan speed in, for example, the major directions of travel. It may be desirable to address this undesirable functionality for the associated weak portion(s) 64 on the gas knife corners 44 and the corners 54 of the cornered shape formed by the openings 50.

Figure 20:
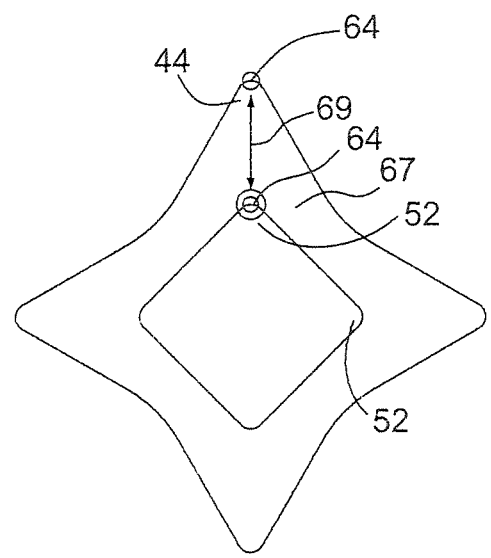
FIG. 20 illustrates, in plan, certain features of an embodiment of a fluid handling structure according to an embodiment of the invention.

FIG. 20 illustrates an embodiment of the invention in which the damper width 69 is large relative to that shown in FIG. 19. The weak section 64 of the cornered shape formed by the openings 50 at the midpoint corner 66 is stronger because the cornered shape is a rhombus, e.g. square, in which the corner 66 is angled to be substantially 180 degrees. Therefore it is not necessary to have large damper width 68 associated with the midpoint corner 66 because an inherent meniscus instability is no longer present.

The gas knife 60 shape is a four pointed star, each acute angle 44 being aligned with a major direction of travel. Each acute angle 44 corresponds to a weak section 64. Similarly the corners 52 of the cornered shape formed by the openings 50 are each weak sections 64. The damper is widest at the damper width 69 which corresponds to the acute angles 44 and the corners 52. In having this arrangement, the critical scan speed may be increased in all directions relative to an arrangement which has substantially constant damper width. In an optimization of this arrangement the width of the damper 67 around the periphery of the cornered shape is selected so that the critical scan speed is the same in any direction of movement relative to a surface facing the undersurface of the fluid handing structure 12 such as a surface of a substrate W and/or a substrate table WT.

The arrangement shown in FIG. 20 may be desirable because the size of the wet footprint of the fluid handling structure 12, i.e. the localized surface of the facing surface wetted at an instant in time, is defined by the shape formed by the openings 50. For a fluid handling structure 12 of the same size, the cornered shape formed by the openings 50 is smallest in the embodiment in FIG. 20 as compared to FIGS. 18 and 19 because a square shape of FIG. 20 would have a smaller area than the star shape of FIGS. 18 and 19. This may assume that distances between each of the four gas knife corners 44 in each embodiment is the same.

At a moment in time, a thermal load is applied by liquid evaporating from the substrate surface after movement under the fluid handling structure 12. Therefore a footprint of a fluid handling structure applies a characteristic thermal load to a substrate which is dependent on the area of the footprint. Because the wet footprint of the embodiment shown in FIG. 20 is small the thermal load may be smaller compared to the embodiments of fluid handling structure of the same size as shown in FIGS. 18 and 19. A smaller footprint may require a smaller liquid supply rate, reducing the amount of immersion liquid introduced to the fluid handling structure 12 and so reducing the maximum thermal load which could be applied. Since the wet footprint is relatively small there is an additional possible benefit: the forces applied to the substrate by the fluid handling structure may be reduced. Note that, as mentioned above, operation of the arrangement may enhance the critical scan performance as well.

An embodiment of the invention is a fluid handling structure for a lithographic apparatus. The fluid handling structure has a plurality of openings. The fluid handling structure is configured such that the openings are directed, in use, towards a substrate and/or a substrate table. The substrate table is configured to support the substrate. The fluid handling structure comprises a gas knife device having an elongate aperture or a plurality of apertures arranged in a line. The aperture or the plurality of apertures is arranged at a distance from the openings selected from the range of 1 mm to 5 mm.

In an embodiment, the distance is selected from the range of 1.5 mm to 4 mm, desirably selected from the range of 2 mm to 3 mm.

In an embodiment, the openings are arranged, in plan, in a closed shape, such as a cornered shape, or an elliptical shape.

In an embodiment, the elongate aperture or the plurality of apertures substantially surround the openings.

In an embodiment, the cornered shape has four corners and four sides, each side having a negative radius of curvature.

In an embodiment, the cornered shape has a smoothly curved corner.

In an embodiment, the smoothly curved corner has a radius selected from the range of 0.5 mm to 4.0 mm, desirably selected from the range of 1 mm to 3 mm, or selected from the range of 1.5 mm to 2.5 mm.

In an embodiment, at least a part of the aperture or the line of the plurality of apertures is substantially parallel to a line joining centers of the openings.

In an embodiment, the part of the aperture or the line of the plurality of apertures that is substantially parallel to the line joining centers of the openings comprises at least 10% of the length of each side of the cornered shape adjacent each corner.

In an embodiment, the openings are inlets for the passage of gas and/or liquid into the fluid handling structure.

In an embodiment, the openings and the aperture or apertures are connected to a pump. The apparatus may comprise a controller connected to the pump and arranged to control the pump so that the gas flow rate through the openings into the fluid handling structure is greater than or equal to the gas flow rate out of the aperture or apertures to form the gas knife.

In an embodiment, the fluid handling structure has a surface in which the openings and the aperture or apertures are formed, there being no other opening or aperture in the surface between the openings and the aperture or apertures.

In an embodiment, the fluid handling structure has a surface in which the openings and the aperture or apertures are formed, the surface being continuous between the openings and the aperture or apertures.

An embodiment of the invention is a lithographic apparatus comprising a fluid handling structure for a lithographic apparatus. The fluid handling structure has a plurality of openings. The fluid handling structure is configured such that the openings are directed, in use, towards a substrate and/or a substrate table. The substrate table is configured to support the substrate. The fluid handling structure comprises a gas knife device having an elongate aperture or a plurality of apertures arranged in a line. The aperture or the plurality of apertures is arranged at a distance from the openings selected from the range of 1 mm to 5 mm.

An embodiment of the invention is a lithographic apparatus comprising a substrate table configured to support a substrate and a fluid handling structure. The fluid handling structure has a plurality of openings configured for the passage of a two phase fluid flow, and comprises a gas knife device comprising an aperture located a distance away from the openings. The fluid handling structure is configured such that the openings are directed, in use, towards the substrate and/or the substrate table, so that the openings are configured to remove liquid from between the fluid handling structure and the substrate, the substrate table, or both and so that most of the gas flow from the gas knife device flows though the openings.

In an embodiment, the openings and the gas knife device are configured so that the gas flow through the openings and the gas knife aperture is balanced.

In an embodiment, the lithographic apparatus further comprises a source of overpressure connected to the aperture or apertures and a source of underpressure connected to the openings, the overpressure and the underpressure being such that the total rate of flow of gas through the aperture or apertures is selected from the range of 80% to 120% of the total rate of flow of gas through the openings.

In an embodiment, the fluid handling structure has in plan a shape which has a corner aligned with a direction of relative motion between the fluid handling structure and the substrate table.

In an embodiment, the direction of relative motion is a scanning and/or stepping direction.

In an embodiment, the shape has at least four corners.

In an embodiment, the lithographic apparatus further comprises a projection system configured to project a patterned beam of radiation onto a target portion of the substrate and the fluid handling structure is configured to supply and confine immersion liquid to a space between the projection system and the substrate table, the substrate, or both.

In an embodiment, the openings are configured to define a meniscus of a liquid body.

An embodiment of the invention is a fluid handling structure for a lithographic apparatus. The fluid handling structure has a plurality of meniscus pinning openings. The fluid handling structure is configured such that the openings are directed, in use, towards a substrate and/or a substrate table. The substrate table is configured to support the substrate. The fluid handling structure comprises a gas knife device having an elongate aperture or a plurality of apertures arranged in a line, and a damper arranged between the aperture or the plurality of apertures and the openings.

In an embodiment, the damper comprises a continuous surface opposing, in use, the substrate and/or substrate table.

In an embodiment, the continuous surface is substantially parallel, in use, to the substrate and/or substrate table.

In an embodiment, the openings form, in plan, a cornered shape in an underside of the fluid handling structure. The line may form a cornered shape in the underside of the fluid handling structure. At least one of the shapes may have at least four corners. At least one of the shapes may have an edge with a negative radius of curvature. At least one of the shapes may have a corner with an obtuse angle. At least one of the shapes may be a rhomboid, a four pointed star or both. The cornered shapes of the line and the openings may be substantially similar.

The damper may be substantially constant in width along the elongate aperture or along the line of apertures.

The damper may have variable width. The width of the damper may widen towards a corner of the elongate aperture or line of apertures.

An embodiment of the invention is a device manufacturing method comprising: providing a fluid, retrieving a liquid, and forcing, liquid. In providing a fluid, a fluid is provided between a final element of a projection system and a substrate In retrieving liquid, liquid is retrieved from between the final element and the projection system by attaching an under pressure to a plurality of openings in a fluid handling structure. In forcing liquid, liquid is forced towards the plurality of openings by supplying gas through a plurality of apertures. The distance between the apertures and the openings is selected from the range of 1 mm to 5 mm.

In an embodiment, the distance is selected from the range of 2 mm to 3 mm.

In an embodiment, supplying gas comprises supplying gas at a rate selected from the range of 100 l/min to 200 l/min.

In an embodiment, the under pressure is such that the gas flow rate through the openings into the fluid handling structure is greater than or equal to the gas flow rate out of the apertures to form the gas knife.

In an embodiment there is provided a lithographic apparatus comprising a fluid handling structure. The fluid handling structure has a plurality of openings. The fluid handling structure is configured such that the openings are directed, in use, towards a substrate and/or a substrate table configured to support the substrate. The fluid handling structure further comprises a gas knife device having at least an elongate aperture, the elongate aperture having a corner.

The elongate aperture may form a closed shape. The closed shape may be a cornered shape.

As will be appreciated, any of the above described features can be used with any other feature and it is not only those combinations explicitly described which are covered in this application.

Although specific reference may be made in this text to the use of lithographic apparatus in the manufacture of a device such as an IC device, it should be understood that the lithographic apparatus described herein may have other applications, such as the manufacture of a device for use in or comprising integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

The controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controllers) may operate according the machine readable instructions of one or more computer programs.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion fluid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more fluid openings including one or more liquid openings, one or more gas openings or one or more openings for two phase flow. The openings may each be an inlet into the immersion space (or an outlet from a fluid handling structure) or an outlet out of the immersion space (or an inlet into the fluid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A fluid handling structure for a lithographic apparatus, the fluid handling structure having a plurality of meniscus pinning openings, the fluid handling structure configured such that the openings are directed, in use, towards a substrate and/or a substrate table configured to support the substrate, the fluid handling structure further comprising a gas knife device having an elongate aperture or a plurality of apertures arranged in a line, and a damper arranged between the aperture or the plurality of apertures and the openings, wherein the damper has a width between the aperture or the plurality of apertures and the openings at a certain position that is larger than the width of the damper adjacent on either side of the certain position.

2. The fluid handling structure of claim 1, wherein the damper comprises a continuous surface opposing, in use, the substrate and/or substrate table.

3. The fluid handling structure of claim 2, wherein the continuous surface is substantially parallel, in use, to the substrate and/or substrate table.

4. The fluid handling structure of claim 1, wherein the openings form, in plan, a cornered shape in an underside of the fluid handling structure.

5. The fluid handling structure of claim 4, wherein at least one of the shapes has at least four corners.

6. The fluid handling structure of claim 4, wherein at least one of the shapes has an edge with negative radius of curvature.

7. The fluid handling structure of claim 4, wherein at least one of the shapes has a corner with an obtuse angle.

8. The fluid handling structure of claim 4, wherein the cornered shape of the line is substantially similar to the cornered shape of the openings.

9. The fluid handling structure of claim 1, wherein the width of the damper widens towards a corner of the elongate aperture or line of apertures.

10. A lithographic apparatus, comprising:
a substrate table configured to support a substrate;
a projection system configured to project a beam of radiation onto the substrate; and
a fluid handling structure having a plurality of meniscus pinning openings, the fluid handling structure configured such that the openings are directed, in use, towards the substrate and/or the substrate table, the fluid handling structure further comprising a gas knife device having an elongate aperture or a plurality of apertures arranged in a line, and a damper arranged between the aperture or the plurality of apertures and the openings, wherein the damper has a width between the aperture or the plurality of apertures and the openings at a certain position that is larger than the width of the damper adjacent on either side of the certain position.

11. The apparatus of claim 10, wherein the damper comprises a continuous surface opposing, in use, the substrate and/or substrate table.

12. The apparatus of claim 10, wherein the openings form, in plan, a cornered shape in an underside of the fluid handling structure.

13. The apparatus of claim 12, wherein at least one of the shapes has at least four corners.

14. The apparatus of claim 12, wherein at least one of the shapes has an edge with negative radius of curvature.

15. The apparatus of claim 12, wherein at least one of the shapes has a corner with an obtuse angle.

16. The apparatus of claim 12, wherein the cornered shape of the line is substantially similar to the cornered shape of the openings.

17. The apparatus of claim 10, wherein the width of the damper widens towards a corner of the elongate aperture or line of apertures.

18. A device manufacturing method, comprising:
confining liquid using a fluid handling structure of a lithographic apparatus, the fluid handling structure having a plurality of meniscus pinning openings, the fluid handling structure configured such that the openings are directed, in use, towards a substrate and/or a substrate table configured to support the substrate;
supplying a gas using a gas knife device of the fluid handling structure, the gas knife device having an elongate aperture or a plurality of apertures arranged in a line, and a damper arranged between the aperture or the plurality of apertures and the openings, wherein the damper has a width between the aperture or the plurality of apertures and the openings at a certain position that is larger than the width of the damper adjacent on either side of the certain position; and
projecting a beam of radiation through the liquid onto the substrate.

19. The method of claim 18, wherein the openings form, in plan, a cornered shape in an underside of the fluid handling structure.

20. The method of claim 18, wherein the width of the damper widens towards a corner of the elongate aperture or line of apertures.

* * * * *

UNITED STATES PATENT AND TRADEMARK OFFICE
CERTIFICATE OF CORRECTION

| | | |
|---|---|---|
| PATENT NO. | : 8,547,523 B2 | Page 1 of 1 |
| APPLICATION NO. | : 12/785913 | |
| DATED | : October 1, 2013 | |
| INVENTOR(S) | : Michel Riepen et al. | |

It is certified that error appears in the above-identified patent and that said Letters Patent is hereby corrected as shown below:

On Title Page 2, Item (56) References Cited - Foreign Patent Documents, Column 1
   replace "JP   2006-1404940 6/2006"
   with --JP   2006-140494 6/2006--.

Signed and Sealed this
Third Day of December, 2013

Margaret A. Focarino
*Commissioner for Patents of the United States Patent and Trademark Office*